US010418582B2

(12) United States Patent
Im et al.

(10) Patent No.: US 10,418,582 B2
(45) Date of Patent: Sep. 17, 2019

(54) ORGANIC LIGHT EMITTING DISPLAY DEVICE

(71) Applicant: LG Display Co., Ltd., Seoul (KR)

(72) Inventors: Jong-Hyeok Im, Busan (KR); Jae-Sung Lee, Seoul (KR); Do-Hyung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/825,421

(22) Filed: Nov. 29, 2017

(65) Prior Publication Data

US 2018/0151828 A1    May 31, 2018

(30) Foreign Application Priority Data

Nov. 30, 2016  (KR) .................. 10-2016-0162383

(51) Int. Cl.
*H01L 27/32* (2006.01)
*H01L 51/52* (2006.01)
*G09G 3/3208* (2016.01)

(52) U.S. Cl.
CPC ....... *H01L 51/5203* (2013.01); *G09G 3/3208* (2013.01); *H01L 27/3272* (2013.01); *H01L 27/3279* (2013.01); *H01L 51/5228* (2013.01); *G09G 2310/0264* (2013.01)

(58) Field of Classification Search
CPC ...... G09G 3/32–3258; G09G 2300/0421–043; G09G 2310/0264; H01L 27/3251; H01L 27/3253; H01L 27/326; H01L 27/3262; H01L 27/3272–3279; H01L 51/5203–5234
See application file for complete search history.

(56) References Cited

U.S. PATENT DOCUMENTS

| 2008/0297678 | A1 | 12/2008 | Lee et al. |
| 2010/0213482 | A1 | 8/2010 | Kim et al. |
| 2011/0140114 | A1 | 6/2011 | Ko et al. |
| 2012/0249904 | A1* | 10/2012 | Morosawa .......... H01L 27/1225 349/38 |

(Continued)

FOREIGN PATENT DOCUMENTS

| EP | 2966705 A1 | 1/2016 |
| JP | 2010-039413 A | 2/2010 |

(Continued)

OTHER PUBLICATIONS

Extended European Search Report issued in counterpart European Patent Application No. 17204360.6 dated Apr. 16, 2018.

(Continued)

*Primary Examiner* — Nathan Danielsen
(74) *Attorney, Agent, or Firm* — Morgan, Lewis & Bockius LLP

(57) ABSTRACT

An organic light emitting display device secures an auxiliary electrode with a sufficient area without forming a passivation layer, an additional planarization film, an additional connection electrode and an auxiliary electrode. Accordingly, manufacturing of a top-emission organic light emitting display device may use three to four fewer masks, thus advantageously simplifying the process and reducing manufacturing costs, the thickness of the organic light emitting display device and the resistance of the second electrode.

12 Claims, 5 Drawing Sheets

(56) References Cited

U.S. PATENT DOCUMENTS

| | | | |
|---|---|---|---|
| 2013/0056784 A1* | 3/2013 | Lee | H01L 27/3279 |
| | | | 257/99 |
| 2015/0188077 A1* | 7/2015 | Kim | H01L 51/5203 |
| | | | 257/40 |
| 2016/0013436 A1 | 1/2016 | Im et al. | |
| 2017/0186831 A1* | 6/2017 | Nam | H01L 27/3272 |

FOREIGN PATENT DOCUMENTS

| | | |
|---|---|---|
| JP | 2010-199554 A | 9/2010 |
| JP | 2011-124212 A | 6/2011 |
| KR | 10-2016-0006520 A | 1/2016 |
| KR | 10-2016-0012876 A | 2/2016 |
| KR | 10-2016-0056487 A | 5/2016 |
| KR | 10-2016-0074333 A | 6/2016 |
| KR | 10-2016-0092826 A | 8/2016 |

OTHER PUBLICATIONS

Office Action dated Oct. 23, 2018 from the Taiwanese Patent Office in counterpart Taiwanese patent application No. 106141688. Note: KR 10-2016-0056487 cited therein is already of record.

Office Action dated Nov. 6, 2018 from the Japanese Patent Office for a counterpart Japanese patent application No. 2017-227446. Note: KR 10-2016-0056487 cited therein is already of record.

Office Action dated Jul. 2, 2019, from the Japanese Patent Office in counterpart Japanese patent application No. 2017-227446.

\* cited by examiner

ORGANIC LIGHT EMITTING DISPLAY DEVICE

This application claims the benefit of Korean Patent Application No. 10-2016-0162383, filed on Nov. 30, 2016, which is hereby incorporated by reference as if fully set forth herein.

BACKGROUND

Technical Field

The present disclosure relates to an organic light emitting display device and a method of manufacturing the same, and more particularly, to an organic light emitting display device to reduce thickness, reduce manufacturing costs, and protect a pad part.

Discussion of the Related Art

Image display devices for displaying a variety of information on a screen, which are being developed into slimmer, lighter weight, more portable and higher-functional forms, are significant technologies in the information-technology era. In response to these requirements, organic light emitting display devices that display an image by controlling the amount of light emitted by an organic light emitting layer attract a great deal of attention as flat panel display devices capable of reducing weight and volume, which are drawbacks of cathode ray tubes.

Organic light emitting display devices display an image through a plurality of pixels disposed in the form of a matrix. Each pixel includes a light emitting element and a pixel driving circuit which independently operates the light emitting element and includes a plurality of transistors, storage capacitors and the like. Each light emitting element includes an emission layer between a first electrode and a second electrode.

In recent years, a top-emission organic light emitting display device to secure an aperture ratio and realize a transparent display has been actively researched. An emission layer of the top-emission organic light emitting display device should permeate an upper electrode, i.e. a second electrode, and emit light, to display an image. Thus, the second electrode is formed using a transparent conductive material. Since the transparent conductive material has higher resistance than a metal, an auxiliary electrode is used to reduce such resistance. In this case, the auxiliary electrode may be formed in the same layer as the first electrode, but cannot be formed such that it overlaps the first electrode. Thus, there is a spatial limitation in increasing an area of the auxiliary electrode, which causes a limitation in reducing the resistance of the second electrode.

Accordingly, there was suggested a top-emission organic light emitting display device which further includes a connection electrode which is interposed via an insulation film between the first electrode and a thin film transistor, to connect the first electrode to the thin film transistor, wherein an auxiliary electrode is formed in the same layer as the connection layer.

However, in this case, stacking this additional layer causes an increase in thickness of the organic light emitting display device and an increase in the number of masks used, thus leading to an increase in manufacturing costs. In addition, in the suggested organic light emitting display device, a metal having high reflectivity such as silver (Ag) is generally used to form the connection electrode and a pad part is formed using the same process as forming the connection electrode. However, when the pad part is formed using silver, the pad part of the organic light emitting display device is corroded due to low corrosion resistance of silver and thus has a problem of contact defects.

SUMMARY

Accordingly, embodiments of the present disclosure are directed to an organic light emitting display device that substantially obviates one or more of the problems due to limitations and disadvantages of the related art.

An aspect of the present disclosure is to provide an organic light emitting display device to reduce thickness, reduce manufacturing costs and protect a pad part.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described an organic light emitting display device comprises a light-shielding layer and a first auxiliary electrode each disposed in a display area of a substrate defined by the display area and a pad area, a buffer layer covering the light-shielding layer and the first auxiliary electrode, a thin film transistor disposed on the buffer layer such that the thin film transistor overlaps the light-shielding layer, a lower pad part disposed on the buffer layer of the pad area, an upper pad part spaced from the lower pad part via an interlayer insulation film and connected to the lower pad part through a pad contact hole, a second auxiliary electrode connected to the first auxiliary electrode through a first contact hole, a planarization film covering the thin film transistor and the second auxiliary electrode, a pad protection layer covering a side surface of the upper pad part and exposing a part of an upper surface of the upper pad part, a first electrode disposed on the planarization film and electrically connected to the thin film transistor, a third auxiliary electrode connected to the second auxiliary electrode through a second contact hole, an organic light emitting layer disposed on the first electrode, and a second electrode disposed on the organic light emitting layer including an emission layer and electrically connected to the third auxiliary electrode.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
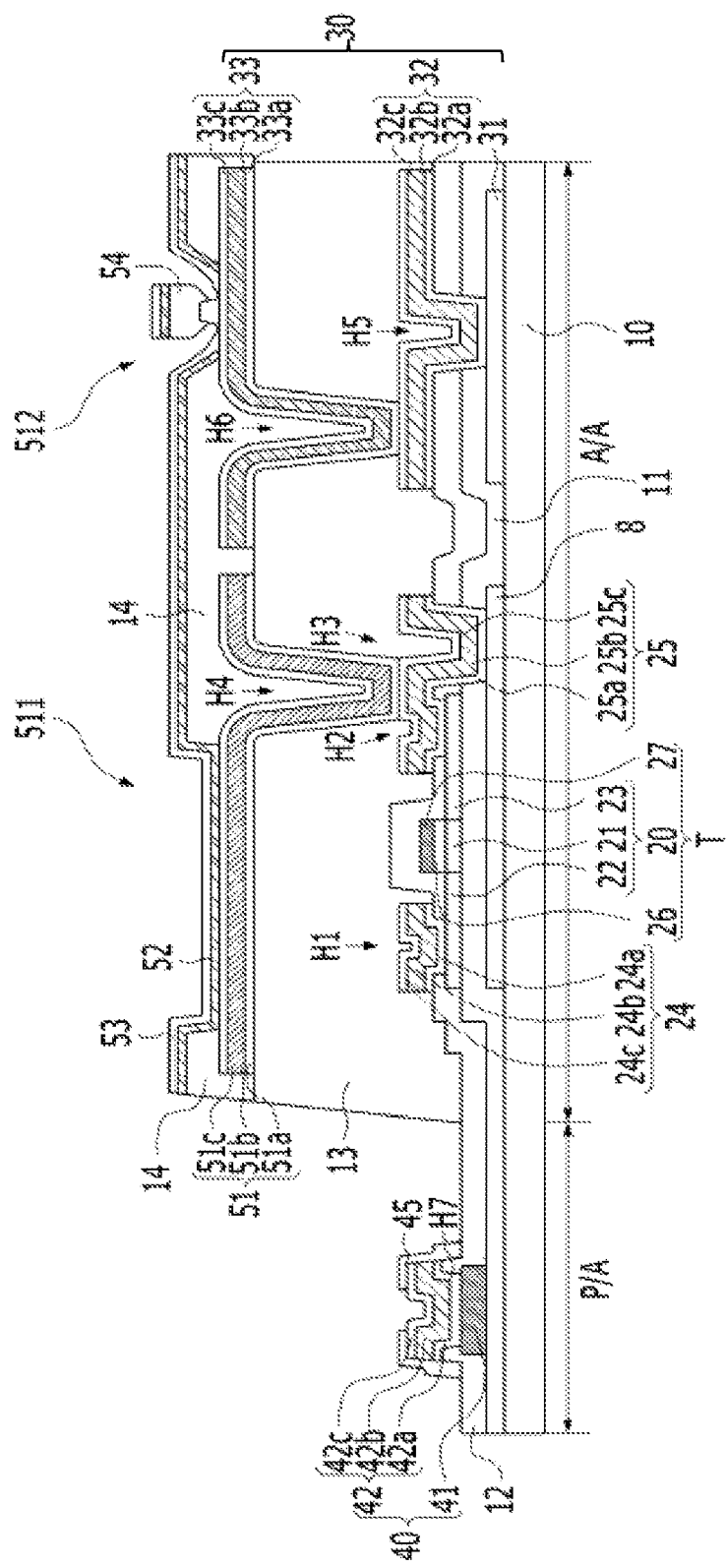
FIG. 1 is a sectional view illustrating an organic light emitting display device according to the present invention.

Hereinafter, preferred embodiments of the present invention will be described with reference to the annexed drawings. Wherever possible, the same reference numbers will be used throughout the drawings to refer to the same or like parts. In the following description, detailed descriptions of technologies or configurations related to the present invention may be omitted so as not to unnecessarily obscure the subject matter of the present invention. Furthermore, the names of elements used in the following description are selected in consideration of ease of description of the specification and may be different from actual names of elements.

It will be understood that in terms of description of positional relationships, when an element is referred to as being "on", "above", "below" or "next to" another element, one or more intervening elements may be present between two elements unless the term "immediately" or "directly" is used.

Although terms such as "first" and "second" may be used to describe a variety of components, these terms only aim to distinguish the same or similar components from one another. Accordingly, throughout the specification, a "first" component may be the same as a "second" component within the technical concept of the present invention, unless specifically mentioned otherwise.

The sizes and thicknesses of elements shown in the drawings are illustrated for convenience of drawings and the present invention is not necessarily limited thereto.

Hereinafter, various embodiments of the present invention will be described with reference to the annexed drawings.

FIG. 1 is a schematic view illustrating an organic light emitting display device according to an embodiment of the present invention.

The organic light emitting display device according to the present invention includes a display area (A/A) and a pad area (P/A).

The organic light emitting display device according to the present invention includes a thin film transistor T disposed in a display area A/A, a first electrode 51 electrically connected to thin film transistor T, an organic light emitting layer 52, a second electrode 53 and an auxiliary electrode 30 electrically connected to the second electrode 53. In addition, the organic light emitting display device according to the present invention includes a pad electrode 40 disposed in the pad area (P/A).

The thin film transistor T includes an active layer 20, a gate insulation film 26, a gate electrode 27 and source/drain electrodes 24 and 25.

The auxiliary electrode 30 includes a first auxiliary electrode 31, a second auxiliary electrode 32 and a third auxiliary electrode 33.

In addition, the pad electrode 40 includes a lower pad part 41 and an upper pad part 42.

This configuration will be described in more detail with reference to FIG. 1. Referring to FIG. 1, a buffer layer is disposed on a substrate 10. The buffer layer 11 prevents moisture or impurities from permeating into the substrate 10 and the substrate 10 functions to planarize the upper surface of the substrate 10. The buffer layer 10 may be formed using an inorganic insulation material such as $SiN_x$ or $SiO_x$.

An active layer 20 made of semiconductor, for example, a silicon or oxide semiconductor is formed on the buffer layer 11. A gate insulation film 26 is disposed on the active layer 20 and a gate electrode 27 is disposed on the gate insulation film 26. The gate electrode 27 is disposed such that it overlaps a channel area 21 of the active layer 20 via the gate insulation film 26. The gate electrode 27 may have a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

A light-shielding layer 8 is disposed under the thin film transistor T. The light-shielding layer 8 functions to block light incident upon the active layer 20 and reduce parasitic capacitance created between the thin film transistor (T) and various lines (not shown). The light-shielding layer 8 may be formed of a metal of silver (Ag), nickel (Ni), gold (Au), platinum (Pt), aluminum (Al), copper (Cu), molybdenum (Mo), titanium (Ti) and neodymium (Nd), or an alloy thereof.

An interlayer insulation film 12 is disposed on the gate electrode 27. The interlayer insulation film 12 extends from the display area A/A to the entire area of a surface of the substrate 10 including the lower pad part 41 of the pad area (P/A). The interlayer insulation film 12 may be formed as a single layer or multiple layers made of an inorganic insulation material such as $SiN_x$ or $SiO_x$.

In this case, the interlayer insulation film 12 includes a first contact hole H1 to expose the source area 22 of the active layer 20 and a second contact hole H2 to expose a drain area 23.

The source electrode 24 is connected to the source area 22 through the first contact hole H1 and the drain electrode 25 is connected to the drain area 23 through the second contact hole H2. In this case, in order to produce equipotentiality between the drain electrode 25 and the active layer 21 and the light-shielding layer 8, the drain electrode 25 may be further connected to the light-shielding layer 8 through a third contact hole H3 formed by removing parts of the interlayer insulation film 12 and the buffer layer 11. When equipotentiality is formed between the drain electrode 25, and the active layer 21 and the light-shielding layer 8, formation of parasitic capacitance between the drain electrode 25 and the active layer 21, or between the active layer 21 and the light-shielding layer 8 is prevented.

The source electrode 24 and the drain electrode 25 may be a single layer or multiple layers which include any one of molybdenum (Mo), aluminum (Al), chromium (Cr), gold (Au), titanium (Ti), nickel (Ni), neodymium (Nd) and copper (Cu), or an alloy thereof, but the present invention is not limited thereto. However, the organic light emitting display device according to the present invention is provided with the aforementioned planarization film 13 made of an organic insulation material, instead of a passivation layer made of an inorganic insulation material on the thin film transistor T, unlike the conventional organic light emitting display device. Therefore, the source electrode 24 and the drain electrode 25 are formed with a multilayer structure so as to protect the electrodes from exterior oxygen, moisture or the like, and the uppermost layer and the lowermost layer are formed using a highly anti-corrosive material so as to protect the electrode layer disposed in the middle part by capping.

For example, the source electrode 24 may include three layers, i.e., a first source fraction layer 24a, a second source fraction layer 24b and a third fraction layer 24c. Similarly, the drain electrode 25 also includes three layers, i.e., a first drain fraction layer 25a, a second drain fraction layer 25b and a third drain fraction layer 25c.

In this case, the first to third source/drain fraction layers 24a to 24c and 25a to 25c may be triple layers of MoTi/Cu/MoTi stacked in this order. However, the first to third source/drain fraction layers 24a to 24c, and 25a to 25c can be formed using various materials, without being limited to the materials described above.

The planarization film 13 is disposed on the thin film transistor T. The planarization film 13 functions to planarize the upper part of the substrate 10 where the thin film transistor T is disposed. The planarization film 13 may be, for example, made of an acrylic resin, an epoxy resin, a phenolic resin, a polyamide resin, a polyimide resin, or the like.

The first electrode 51 is formed on the planarization film 13. The first electrode 51 is provided in an opening 511 to define a light emitting area in the substrate 100 and is electrically connected to the thin film transistor T. In this case, the first electrode 51 is provided in the planarization film 13 and is electrically connected to the drain electrode 125 of the thin film transistor T through a fourth contact hole H4 to expose the drain electrode 125.

The first electrode 51 functions as an anode or cathode depending on the type of the thin film transistor T. In the present embodiment, the first electrode 51 functions as an anode of an organic light emitting element. In this case, the first electrode 51 is made of a transparent conductive material having a relatively high work function, for example, ITO, IZO, ZnO or IGZO. In addition, the first electrode 51 may include a highly reflective metal material, for example, aluminum (Al), silver (Ag), APC (Ag/Pb/Cu) or the like. This aims at reflecting light incident upon a lower part of an organic light emitting element toward an upper part thereof, to contribute to light emission of the organic light emitting element in order to improve efficiency and lifespan of a top-emission light emitting device. In this case, a highly reflective metal such as aluminum (Al) or silver (Ag) is vulnerable to oxidation by exterior oxygen, moisture or the like. Accordingly, the first electrode 51 also includes three layers, i.e., a first electrode lower layer 51a, a first electrode middle layer 51b and a first electrode upper layer 51c, the first electrode middle layer 51b includes a highly reflective material such as Ag, and the first electrode lower layer 51a and the first electrode upper layer 51c are preferably formed using a transparent conductive material, so as to protect the highly reflective metal layer of the first electrode middle layer 51b. In this case, the first electrode upper layer 51c is made of a transparent conductive material, so that light reflected by the first electrode middle layer 51b passes through the first electrode upper layer 51c and is emitted toward the upper part of the organic light emitting device. Based on these characteristics, the organic light emitting display device according to the present invention has advantages of improved efficiency and lifespan of the organic light emitting element because light incident upon the lower part of the light emitting device is reflected toward the upper part, contributing to light emission of the organic light emitting element.

A bank insulation film 14 is formed to cover a part of the first electrode 51 and defines an opening 511 which is a light emitting area. The bank insulation film 14 may be made of an acrylic resin, an epoxy resin, a phenolic resin, a polyamide resin, a polyimide resin or the like.

The organic light emitting layer 52 is provided on the first electrode 51. In this case, the organic light emitting layer 52 may have a structure of hole injection layer (HIL)/hole transport layer (HTL)/light emitting layer (EML)/electron transport layer (ETL)/electron injection layer (EIL). On top of that, the organic light emitting layer 52 may further include at least one functional layer to improve luminous efficacy and lifespan of the light emitting layer, for example, a charge generation layer to generate charges, an additional electron transport layer, an additional hole transport layer or the like.

The organic light emitting layer 52 may extend to cover the upper part of the insulation film 14 to reduce the number of masks. In this case, the light emitting layer of the organic light emitting layer 52 may be provided only on the first electrode 51 and may be not formed in other areas.

The second electrode 53 is provided to cover the upper surfaces of the organic light emitting layer 52 and the bank 14. When the first electrode 51 serves as an anode, the second electrode 53 serves as a cathode. In the top-emission organic light emitting display device, the second electrode 53 is formed using a metallic material having a small thickness (for example, about 200 Å or less) to permeate light and having a low work function, so that light from the organic light emitting layer 52 passes through the second electrode 53 and thus realizes top-emission. The material that can be used in the second electrode 53 may for example include at least one of silver (Ag), titanium (Ti), aluminum (Al), molybdenum (Mo), and an alloy of silver (Ag) and magnesium (Mg). In addition, the second electrode 53 is formed using a transparent conductive material such as ITO, IZO, IGZO or ZnO, thus allowing light from the organic light emitting layer 52 to pass through the second electrode 53 and realizing top-emission.

The second electrode 53 made of a metal with an extremely small thickness or a transparent conductive material has relatively high resistance. When the second electrode 53 is a cathode, as the resistance of the second electrode 53 increases, low supply voltage (VSS) supplied to the organic light emitting element increases, thus decreasing luminance, efficacy and lifespan of the organic light emitting element. In an attempt to solve these problems, in order to reduce the resistance of the second electrode 53, the second electrode 53 is electrically connected to the auxiliary electrode 30. The auxiliary electrode 30 is formed using a material having a relatively low resistance, so that the second electrode 53 is connected to the auxiliary electrode 30, thus decreasing the resistance of the second electrode 53.

In this case, the auxiliary electrode 30 may have a three-layer structure including a first auxiliary electrode 31, a second auxiliary electrode 32 and a third auxiliary electrode 33, and the second electrode 53 may be electrically connected to the third auxiliary electrode 33 exposed by removing a part of the bank insulation film 14.

The structure of the auxiliary electrode 30 will be described in more detail below.

The first auxiliary electrode 31 is formed on the same layer as the light-shielding layer 8, that is, on the substrate 10, and is covered with the buffer layer 11. In this case, the first auxiliary electrode 31 may be formed using the same material as the light-shielding layer 8. As described before, since the interlayer insulation film 12 is provided over the entire surface of the substrate 10, the buffer layer 11 and the interlayer insulation film 12 are provided on the first auxiliary electrode 31.

The second auxiliary electrode 32 is provided in an area where the first auxiliary electrode 31 overlaps the interlayer insulation film 12. The second auxiliary electrode 32 is connected to the first auxiliary electrode 31 through a fifth contact hole H5 exposing the first auxiliary electrode 31 by removing parts of the buffer layer 11 and the interlayer insulation film 12.

The second auxiliary electrode 32 may be formed in the same layer using the same material as the source/drain electrodes 24 and 25. That is, like the source/drain electrodes 24 and 25 consisting of first to third fraction layers, the second auxiliary electrode 32 may also have a three-layer structure including a first auxiliary electrode fraction layer 32a, a second auxiliary electrode fraction layer 32b and a third auxiliary electrode fraction layer 32c, but the present invention is not limited thereto. The second auxiliary electrode 32 may be formed as a single layer or multiple layers. For example, when the source/drain electrodes 24 and 25 are three layers having a stack of MoTi/Cu/MoTi, the first auxiliary electrode fraction layer 32a and the third auxiliary electrode fraction layer 32c are made of MoTi and the second auxiliary electrode fraction layer 32b is made of Cu, so that the second auxiliary electrode 32 is formed with three layers of MoTi/Cu/MoTi stacked in this order. In this case, the materials for the second auxiliary electrode 32 are not limited to the materials described above and may be variably selected from the aforementioned metals constituting the source/drain electrodes 25.

The planarization film 13 is formed on the thin film transistor T and extends to the upper part of the second auxiliary electrode 32. In this case, a sixth contact hole H6 exposing the upper surface of the second auxiliary electrode 32 by removing the planarization film 13 is provided in a part of the area where the planarization film 13 overlaps the second auxiliary electrode 32.

The third auxiliary electrode 33 is formed on the planarization film 13. The third auxiliary electrode 33 can be formed without any additional process, because it is formed using the same material in the same layer as the first electrode 51.

Like the first electrode 51 including a three layer structure including a first electrode lower layer 51a, a first electrode middle layer 51b and a first electrode upper layer 51c, the third auxiliary electrode 33 is also formed with a three-layer structure, but the present invention is not limited thereto. The first electrode 51 may be formed as a single layer or multiple layers. When the third auxiliary electrode 33 is a three-layer structure, the third auxiliary electrode 33 may have a three-layer structure of a fourth auxiliary electrode fraction layer 33a, a fifth auxiliary electrode fraction layer 33b and a sixth auxiliary electrode fraction layer 33c.

The third auxiliary electrode 33 includes the fifth auxiliary electrode fraction layer 33b made of a highly reflective material such as Ag, like the first electrode 51, and the fourth auxiliary electrode fraction layer 33a and the sixth auxiliary electrode fraction layer 33c made of a transparent conductive material, thereby having a structure for protecting the highly reflective metal layer of the first electrode middle layer 51b.

The bank insulation film 14 may be provided on the third auxiliary electrode 33 as well. The bank insulation film 14 covers a part of the first electrode 51 and extends to the upper part of the second auxiliary electrode 32. In this case, an organic hole 512 exposing a part of the second auxiliary electrode 32 by removing a part of the bank insulation film 154 is provided in the second auxiliary electrode 32.

A barrier 54 may be further provided in the organic hole 512. The barrier 54 has a side surface end having a reversed taper shape, but the present invention is not limited thereto. The barrier 54 may be formed using the same material as the bank insulation film 14, but the present invention is not limited thereto. The barrier 54 has both side surfaces having a reversed taper shape, so that a part of the organic light emitting layer 52 is discontinuously formed on the upper side of the barrier 54, while the organic light emitting layer 52 is not formed in a neighboring area of the barrier 54. Therefore, the sixth auxiliary electrode fraction layer 33c of the third auxiliary electrode 33 is exposed in the neighboring area of the barrier 54 and the second electrode 53 contacts the third auxiliary electrode 33 in the neighboring area of the barrier 54.

As described above, the second electrode 53 is formed on both the opening 511 and the bank insulation film 14. That is, the second electrode 53 is formed in a region where the sixth auxiliary electrode fraction layer 33c is disposed, and a part of the second electrode 53 is discontinuously formed on the discontinuous organic light emitting layer 52 in an upper part of the barrier 54 as well.

In this case, unlike the organic light emitting layer 52, the second electrode 53 continuously extends from the second electrode of the opening 511 to the neighboring area of the barrier 54. Therefore, the third auxiliary electrode 33 and the continuous second electrode 53, a part of which is exposed through the organic hole 512, are electrically connected in the neighboring area of the barrier 54.

As described above, the second electrode 53 is connected to the auxiliary electrode 30, thus decreasing the high resistance of the second electrode 53. In particular, in the organic light emitting display device according to an embodiment of the present invention, the auxiliary electrode 30 includes first to third auxiliary electrodes 31 to 33 sequentially stacked and thus has a greatly increased area of the auxiliary electrode 30 as compared to the conventional case, thereby effectively reducing the resistance of the second electrode 53. In particular, when the auxiliary electrode 30 is formed as a three-layer structure, the resistance of the second electrode 53 is effectively reduced without increasing the area of the third auxiliary electrode 33 formed in the same layer as the first electrode 51. Accordingly, there is no need to insert a connection electrode between the first electrode 51 and the drain electrode 25 in order to increase an auxiliary electrode, like a conventional organic light emitting display device, so that the thickness of the organic light emitting display device can be reduced, the number of mask used for forming the connection electrode can be reduced and the overall process of manufacturing the organic light emitting display device can thus be simplified and manufacturing costs can be reduced.

Although not shown, a sealing part may be provided on the second electrode 53. The sealing part functions to protect the organic light emitting element and elements such as thin film transistors T from exterior shock, and prevent permeation of moisture. In this case, the sealing part may be a single layer made of an inorganic insulation material such as $SiO_x$ or $SiN_x$, or multiple layers made of the inorganic insulation materials alternately stacked.

The pad electrode 40 is disposed on the substrate 10 of the pad part (P/A). This configuration will be described in more detail with reference to FIG. 1. The pad electrode 40 includes a lower pad part 41 and an upper pad part 42.

Although not shown in FIG. 1, the pad electrode 40 contacts driving lines (not shown) for connection to driving circuits (not shown) to drive the organic light emitting display device. In addition, the driving circuits supply a number of driving signals to drive the organic light emitting display device through the pad electrode 40. The pad electrode 40 according to the present invention has a two-layer structure including a lower pad part 41 and an upper pad part 42, thus decreasing the resistance of the pad electrode 40 and making contact easy owing to creation of contact in an upper layer.

The lower pad part 41 is provided on the pad area (P/A) of the buffer layer 11 provided over the entire area of a surface of the substrate 10. The lower pad part 41 may be formed using the same material as the gate electrode 27 of the thin film transistor T.

An interlayer insulation film 12 is disposed on the lower pad part 42. The interlayer insulation film 12 extends from the display area A/A to the entire surface of the substrate 10, thus covering the lower pad part 42. In this case, a pad part contact hole H7 exposing an upper part of the lower pad part 42 by removing a part of the interlayer insulation film 12 is provided a region corresponding to the lower pad part 42. That is, the interlayer insulation film 12 covers a side surface of the lower pad part 42 to prevent corrosion of the metal constituting the lower pad part 42.

The upper pad part 42 is provided in an area where the interlayer insulation film 12 overlaps the lower pad part 42.

The upper pad part 42 may be formed using the same material as the source/drain electrodes 24 and 25. That is, the upper pad part 42 may be a single layer or multiple layers which include any one of molybdenum (Mo), aluminum (Al), chromium (Cr), gold (Au), titanium (Ti), nickel (Ni), neodymium (Nd) and copper (Cu), that can be used to form the source/drain electrodes 24 and 25, or an alloy thereof, but the present invention is not limited thereto.

The upper pad part 42 may have a three-layer structure, like the source/drain electrodes 24 and 25 having a three-layer structure. For example, like the source/drain electrodes 24 and 25 including first to third fraction layers, the upper pad part 42 may also have a three-layer structure including a first pad part fraction layer 42a, a second pad part fraction layer 42b and a third pad part fraction layer 42c, but the present invention is not limited thereto. In this case, when the source/drain electrodes 24 and 25 are three layers of MoTi/Cu/MoTi stacked in this order, the first pad part fraction layer 42a and the third pad part fraction layer 42c are made of MoTi and the second pad part fraction layer 42b is made of Cu, so that the upper pad part 42 can have a three-layer structure of MoTi/Cu/MoTi stacked in this order, but the present invention is not limited to these materials.

The pad protection film 45 is provided to cover a side surface of the upper pad part 42. In addition, the pad protection film 45 does not entirely cover the upper surface of the upper pad part 42 and exposes a part of the upper pad part 42. Through the upper pad part 42 having the exposed upper surface, the pad electrode 40 contacts various lines and receives driving signals to drive the organic light emitting display device.

The pad protection film 45 covers a side surface of the upper pad part 42. The second pad part fraction layer 42b of the upper pad part 42 may be made of copper (Cu) having weak corrosion resistance. Thus, the pad protection film 45 surrounds the second pad part fraction layer 42b, thus advantageously preventing corrosion of the second pad part fraction layer 42b.

In particular, when the upper pad part 42 is formed at the same time as the source/drain electrodes 24 and 25, the defect, corrosion of the second pad part fraction layer 42b, may be generated by the etchant used for forming the first electrode 51. Thus, the pad protection film 45 surrounds the second pad part fraction layer 42b, thus preventing corrosion of the second pad part fraction layer 42b.

The pad protection film 45 can be formed using the same material as the planarization film 13 at the same time. That is, like the planarization film 13, the pad protection film 45 may be made of an acrylic resin, an epoxy resin, a phenolic resin, a polyamide resin, a polyimide resin or the like. In this case, as described above, the second pad part fraction layer 42b is formed using a metal such as copper (Cu). When the acrylic resin is connected to the second pad part fraction layer 42b including copper (Cu), the second pad part fraction layer 42b may be corroded, but the polyimide resin has no possibility of causing this phenomenon. Accordingly, in order to protect the second pad part fraction layer 42b, the pad protection film 45 is most preferably formed using a polyimide resin. Accordingly, when the pad protection film 45 and the planarization film 13 are formed at the same time, the planarization film 13 is also preferably formed using a polyimide resin.

FIGS. 2A to 2D are schematic diagrams illustrating a method of manufacturing the organic light emitting display device according to the present invention.

Figure 2A:
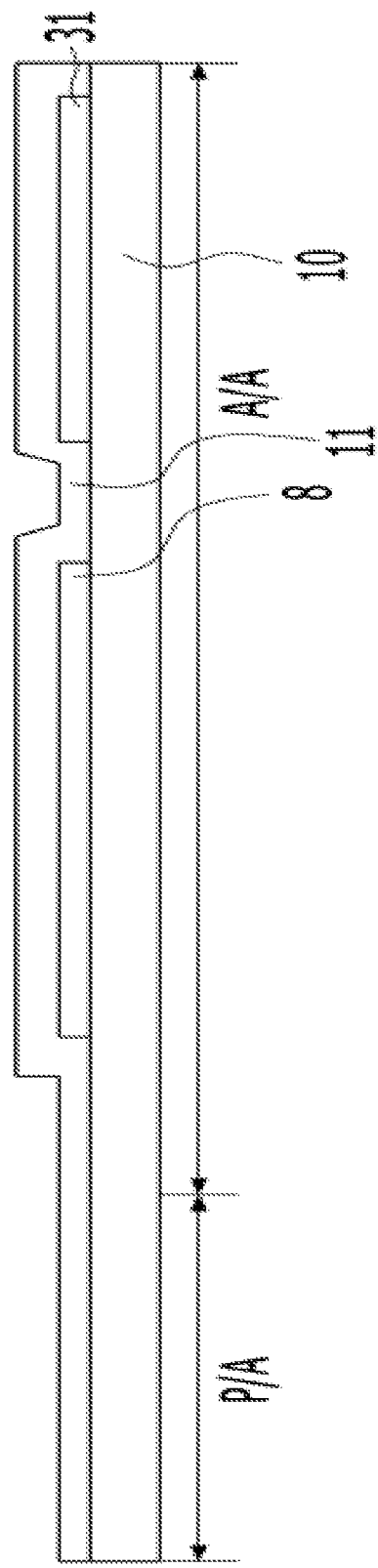
FIGS. 2A to 2D are schematic diagrams illustrating a method of manufacturing the organic light emitting display device according to the present invention.

First, as shown in FIG. 2A, a light-shielding layer and a first auxiliary electrode 31 are formed on a substrate 10 and a buffer layer 11 is formed by deposition over the entire area of a surface of the substrate 10 to cover the upper parts thereof. The light-shielding layer 8 and the first auxiliary electrode 31 can be simultaneously formed by depositing a single material selected from silver (Ag), nickel (Ni), gold (Au), platinum (Pt), aluminum (Al), copper (Cu), molybdenum (Mo), titanium (Ti) and neodymium (Nd), or an alloy thereof, followed by patterning.

Figure 2B:
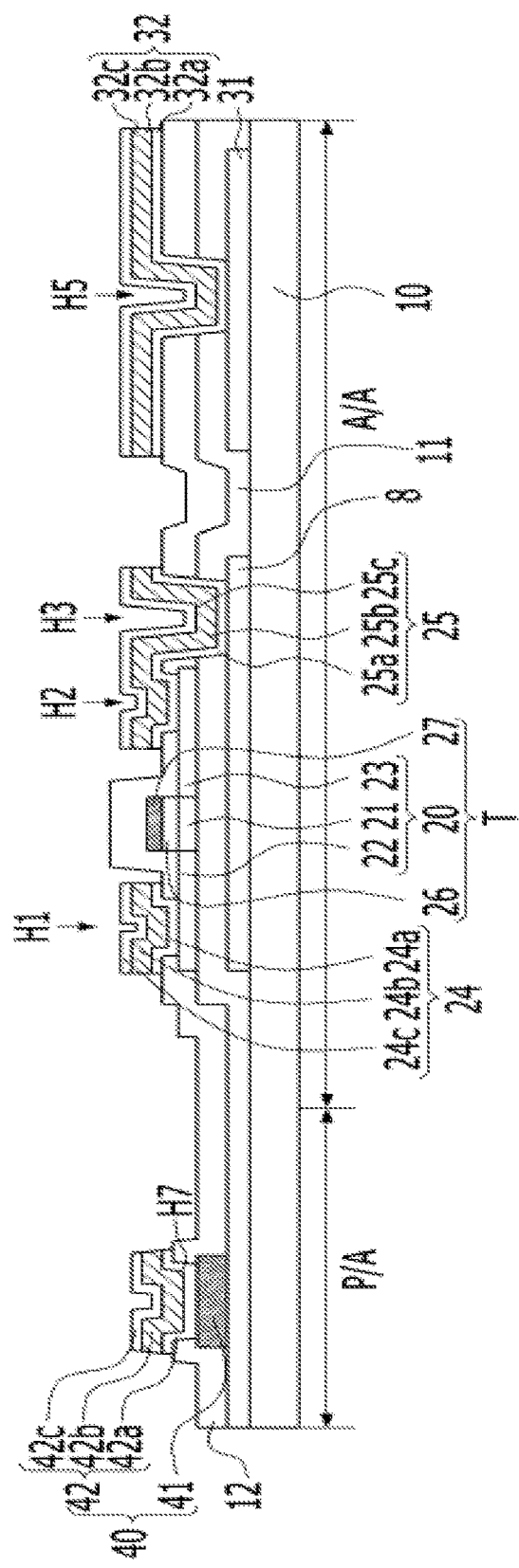

Then, as shown in FIG. 2B, an active layer 20 made of a semiconductor material is formed on the buffer layer 11. In addition, a gate insulation film 26 and a gate electrode 27 are sequentially formed on the channel area 21 of the active layer 20.

In addition, a lower pad part 41 is formed by the same process as forming the gate electrode 27. The gate electrode and lower pad part 41 may be formed by depositing a second metal layer (not shown) having a single layer or multilayer structure which includes any one of molybdenum (Mo), aluminum (Al), chromium (Cr), gold (Au), titanium (Ti), nickel (Ni), neodymium (Nd) and copper (Cu), or an alloy thereof, followed by patterning, but the present invention is not limited thereto.

Then, the active layer 20 is doped with impurities using the gate electrode 27 as a mask to form a source area 22 and a drain area 23. When the active layer 20 is made of an oxide semiconductor, the source and drain areas 22 and 23 can be formed by solidifying both sides of the active layer 20 by plasma treatment.

Next, an interlayer insulation film 12 is formed over the entire surface of the substrate 10 on the gate electrode 27 and the lower pad part 41. The interlayer insulation film 12 may be made of an inorganic insulation material, like the buffer layer 10.

Then, the interlayer insulation film 12 is patterned to form a first contact hole H1 exposing the source area 22 and a second contact hole H2 exposing the drain area 23. In this case, in the display area A/A, parts of the interlayer insulation film 12 and the buffer layer 11 are patterned to form a third contact hole H3 exposing the light-shielding layer 8 and a fifth contact hole H5 exposing the first auxiliary electrode 31. In addition, a pad part contact hole H7 exposing the upper surface of the lower pad part 41 by patterning the interlayer insulation film 12 is provided in the pad area (P/A).

Then, on the interlayer insulation film 12, the source electrode 24 connected to the source area 22 through the first contact hole H1 is formed and a drain electrode 25 connected to the drain area 23 through the second contact hole H2 is formed. At this time, the drain electrode 25 may be connected to the light-shielding layer 8 through the third contact hole H3, but the present invention is not limited thereto. At the same time, on the interlayer insulation film 12, a second auxiliary electrode 32 connected to the first auxiliary electrode 31 through the fifth contact hole H5 and an upper pad part 42 connected to the lower pad part 41 through the seventh contact hole H7 are formed.

In this case, the source electrode 24, the drain electrode 25, the second auxiliary electrode 32 and the upper pad part 42 may have a multilayer structure, as described above. For example, when they have a three-layer stack structure of MoTi/Cu/MoTi, they can be simultaneously formed by stacking three-layer metals of MoTi/Cu/MoTi over the entire upper surface of the interlayer insulation film 12 and simultaneously patterning the same.

Figure 2C:
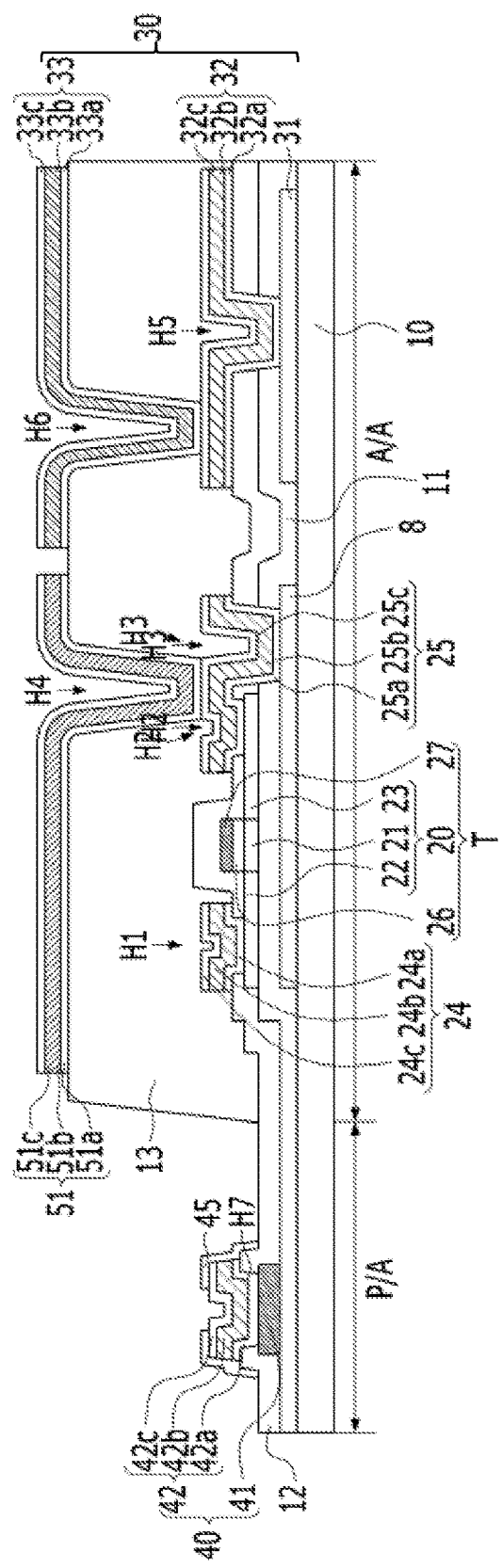

Then, as shown in FIG. 2C, a planarization film 13 is formed on the thin film transistor T and the second auxiliary electrode 32. The planarization film 13 may be made of an acrylic resin, an epoxy resin, a phenolic resin, a polyamide resin, a polyimide resin or the like.

At the same time, a pad protection film 45 is formed so as to cover a side surface of the upper pad part 42 of the pad electrode 40 provided in the pad area (P/A). The pad protection film 45 is formed using the same material as the planarization film 13.

In the formation of the planarization film 13 and the pad protection film 45, the pad protection film 45 is patterned such that the thickness of the pad protection film 45 is smaller than that of the planarization film 13 using a halftone mask or the like.

In addition, the planarization film 13 is patterned to form a fourth contact hole H4 exposing a part of the drain electrode 25 and a sixth contact hole exposing a part of the second auxiliary electrode 32. At the same time, a part of the pad protection film 45 is patterned in the pad area (P/A), to expose an upper surface of the upper pad part 42. In addition, a first electrode 51 and a third auxiliary electrode 33 are formed on the planarization film 13. As described above, the first electrode 51 and the third auxiliary electrode 33 may be formed with a three-layer structure. For this purpose, the first electrode 51 and the third auxiliary electrode 33 may be formed by depositing a plurality of metal layers and then simultaneously patterning.

For example, assuming that the lower layer 51a and the upper layer 51 of the first electrode 51, and fourth and sixth auxiliary electrode fraction layers 33a and 33c of the third auxiliary electrode 33 are made of ITO and the middle layer 51b of the first electrode 51 and the fifth auxiliary electrode fraction layer 33b are made of Ag, these layers can be formed by sequentially depositing metal layers in the order of ITO/Ag/ITO and then simultaneously patterning. In this case, the pad electrode 40 including the pad part 45 includes a metal having poor corrosion resistance such as Cu, but the layer made of the metal with poor corrosion resistance is sealed by the pad protection film 45 and only a metal with a high corrosion resistance on the pad protection film 45 is exposed, so that an impact of the etchant used for patterning to form the first electrode 51 and the third electrode 33 is small.

Figure 2D:
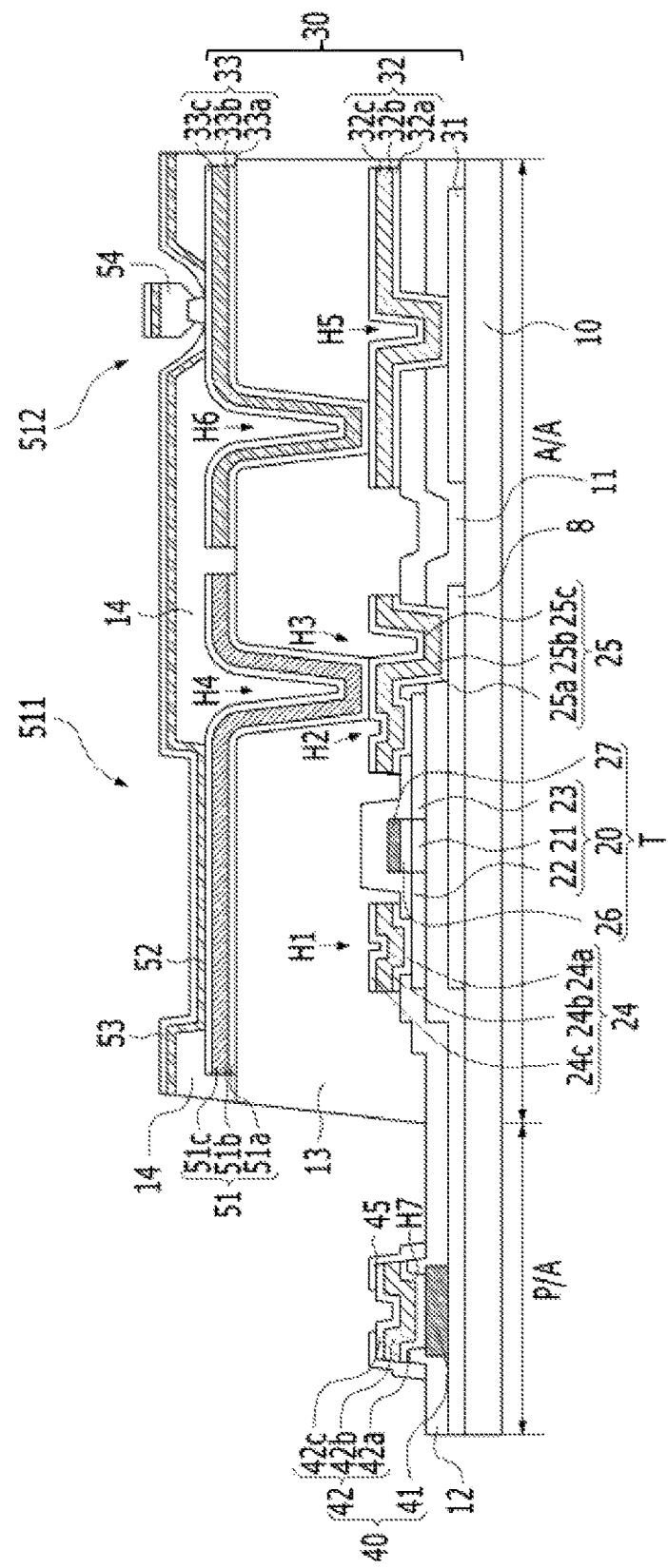

Then, as shown in FIG. 2D, a bank insulation film 14 is formed on the first electrode 51 and the third auxiliary electrode 33. The bank insulation film 14 may be made of an acrylic resin, an epoxy resin, a phenolic resin, a polyamide resin, a polyimide resin or the like, but the present invention is not limited thereto. Then, the bank insulation film 14 is patterned to form an opening 511 and an organic hole 512.

Meanwhile, a barrier 54 having a reversed taper shape is formed on the third auxiliary electrode 33 exposed through the organic hole 512. The bank insulation film 14 and the barrier 54 can be simultaneously formed and can be formed by different processes. The barrier 54 may be formed using the same material as the bank insulation film 14.

In addition, an organic light emitting layer 52 is formed on the first electrode 51 and the bank insulation film 14.

The organic light emitting layer 52 may include a hole injection layer (HIL), a hole transport layer (HTL), an emission layer (EML), an electron transport layer (ETL), and an electron injection layer (EIL).

The second electrode 53 is formed over the entire area of a surface of the substrate 10. The second electrode 53 is formed to a small thickness using a material having a low work function such as silver (Ag), titanium (Ti), aluminum (Al), molybdenum (Mo) and magnesium (Mg), or an alloy thereof, or a transparent conductive material such as ITO, IZO, IGZO or ZnO. The second electrode 53 may contact the third auxiliary electrode 33 of the auxiliary electrode 30 in the neighboring area of the barrier 54 as described above.

In addition, a sealing layer (not shown) is formed over the entire surface of the lower substrate 10. The sealing layer may be a single layer including at least one of $SiO_x$ and $SiN_x$, or multiple layers including $SiO_x$ and $SiN_x$ alternately stacked.

The conventional organic light emitting display device includes separate layers including a connection electrode and an auxiliary electrode between the drain electrode and the first electrode, and further includes an additional planarization layer on the connection electrode and the auxiliary electrode. In addition, the conventional organic light emitting display device further includes a passivation layer made of an inorganic film to protect the pad part.

Meanwhile, in the organic light emitting display device according to the present invention, instead of forming the passivation layer, to provide the feature of passivation, the pad protection film 45 for protecting the upper pad part is formed by a process of forming the polyimide (PI) planarization film 13 while forming the source/drain electrodes 24 and 25, the second auxiliary electrode 32 and the upper pad part 42, each having a three-layer stack structure. In addition, the organic light emitting display device according to the present invention does not need to form a connection electrode and an auxiliary electrode disposed in the same layer as the connection electrode, and realizes the planarization layer as a single layer.

In conclusion, the organic light emitting display device according to the present invention can secure the auxiliary electrode 30 with a sufficient area without forming a passivation layer, an additional planarization film, an additional connection electrode and an auxiliary electrode. Accordingly, advantageously, the top-emission organic light emitting display device according to the present invention can reduce three to four masks than the conventional organic light emitting display device and thus simplify the process, and reduce manufacturing costs, the thickness of the organic light emitting display device and the resistance of the second electrode 53.

The organic light emitting display device according to the present invention can secure the auxiliary electrode with a sufficient area without forming a passivation layer, an additional planarization film, an additional connection electrode and an auxiliary electrode. Accordingly, the top-emission organic light emitting display device according to the present invention requires three to four fewer masks than the conventional organic light emitting display device, thus advantageously simplifying the process and reducing manufacturing costs, the thickness of the organic light emitting display device and the resistance of the second electrode.

It will be apparent to those skilled in the art that various modifications and variations can be made in the organic light emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
    a light-shielding layer and a first auxiliary electrode each disposed in a display area of a substrate defined by the display area and a pad area;
    a buffer layer covering the light-shielding layer and the first auxiliary electrode;
    a thin film transistor disposed on the buffer layer such that the thin film transistor overlaps the light-shielding layer;
    a lower pad part disposed on the buffer layer of the pad area;
    an upper pad part spaced from the lower pad part via an interlayer insulation film and connected to the lower pad part through a pad contact hole;
    a second auxiliary electrode connected to the first auxiliary electrode through a first contact hole;
    a planarization film covering the thin film transistor and the second auxiliary electrode;
    a pad protection layer covering a side surface of the upper pad part and exposing a part of an upper surface of the upper pad part;
    a first electrode disposed on the planarization film and electrically connected to the thin film transistor;
    a third auxiliary electrode connected to the second auxiliary electrode through a second contact hole;
    an organic light emitting layer disposed on the first electrode; and
    a second electrode disposed on the organic light emitting layer including an emission layer and electrically connected to the third auxiliary electrode.

2. The organic light emitting display device according to claim 1, wherein the pad protection layer is formed using the same material as the planarization film.

3. The organic light emitting display device according to claim 1, wherein the thin film transistor comprises:
    an active layer disposed on the buffer layer and including a channel area, a source area and a drain area;
    a gate insulation film disposed on the channel area of the active layer;
    a gate electrode disposed on the gate insulation film;
    a source electrode connected to the source area of the active layer; and
    a drain electrode connected to the drain area of the active layer,
    wherein the interlayer insulation film covers the gate electrode, and
    the lower pad part is disposed in the same layer as the gate electrode and is formed using the same material as the gate electrode.

4. The organic light emitting display device according to claim 3, wherein the source electrode and the drain electrode are disposed in the same layer as the upper pad part and the second auxiliary electrode, and are formed using the same material as the upper pad part and the second auxiliary electrode.

5. The organic light emitting display device according to claim 3, wherein at least one of the source electrode, the drain electrode, the upper pad part, and the second auxiliary electrode has a stack structure including three metal layers.

6. The organic light emitting display device according to claim 5, wherein the three metal layers are MoTi, Cu, and MoTi sequentially stacked.

7. The organic light emitting display device according to claim 1, further comprising:
    a bank insulation film disposed on the first electrode so as to expose a part of the first electrode, to define a pixel area and expose a part of the third auxiliary electrode; and
    a barrier disposed on the exposed part of third auxiliary electrode and having a reversed taper shape,
    wherein the third auxiliary electrode is electrically connected to the second electrode in a neighboring area of the barrier.

8. The organic light emitting display device according to claim 2, wherein the pad protection layer and the planarization film comprise polyimide (PI).

9. The organic light emitting display device according to claim 1, wherein at least one of the first electrode and the third auxiliary electrode has a stack structure of three metal layers including a lower layer, a middle layer, and an upper layer.

10. The organic light emitting display device according to claim 9, wherein the three metal layers are ITO, Ag, and ITO sequentially stacked.

11. The organic light emitting display device according to claim 1, wherein:
    any one electrode of the thin film transistor is connected to the light-shielding layer through a contact hole.

12. The organic light emitting display device according to claim 1, wherein:
    the pad protection layer is formed on the same layer as the planarization film using the same material as the planarization film and separate from the planarization film,
    the pad protection layer has a smaller thickness than that of the planarization film, and
    the interlayer insulation film under the pad protection layer is exposed on the periphery of side surfaces of the pad protection layer in the pad area.

* * * * *